United States Patent
Song et al.

(10) Patent No.: US 9,640,763 B2
(45) Date of Patent: May 2, 2017

(54) DISPLAY SCREEN AND METHOD OF PREPARE THE SAME

(71) Applicant: BOE TECHNOLOGY GROUP CO., LTD., Beijing (CN)

(72) Inventors: Song Song, Beijing (CN); Kazuyoshi Nagayama, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/763,928

(22) PCT Filed: Mar. 17, 2015

(86) PCT No.: PCT/CN2015/074406
§ 371 (c)(1),
(2) Date: Jul. 28, 2015

(87) PCT Pub. No.: WO2016/065803
PCT Pub. Date: May 6, 2016

(65) Prior Publication Data
US 2016/0211450 A1    Jul. 21, 2016

(30) Foreign Application Priority Data

Oct. 31, 2014  (CN) .......................... 2014 1 0602823

(51) Int. Cl.
*H01L 51/00*    (2006.01)
*H01L 21/77*    (2017.01)
(Continued)

(52) U.S. Cl.
CPC ............ *H01L 51/003* (2013.01); *H01L 21/77* (2013.01); *H01L 27/3262* (2013.01);
(Continued)

(58) Field of Classification Search
CPC ............ H01L 51/0545; H01L 51/0036; H01L 51/0541
See application file for complete search history.

(56) References Cited

U.S. PATENT DOCUMENTS 8,917,516 B2 * 12/2014 Kim ...................... G06F 1/1652
                                                       361/679.01
2008/0100789 A1    5/2008 Kamiya
2013/0194761 A1    8/2013 Kim

FOREIGN PATENT DOCUMENTS

CN        202855256 U    4/2013
CN        104332487 A    2/2015
(Continued)

OTHER PUBLICATIONS

Chinese Office Action in Chinese Application No. 201410602823.1 mailed Aug. 31, 2016 with English translation.
(Continued)

*Primary Examiner* — Quoc Hoang
(74) *Attorney, Agent, or Firm* — Collard & Roe, P.C.

(57) ABSTRACT

A display screen and a method of preparing the same are disclosed. The method includes steps of: forming a flexible base layer (20) on a rigid base substrate (10), wherein the rigid base substrate (10) includes a first region (101), a second region (102), and a connection region (103) between the first region and the second region, and the flexible base layer (20) is at least formed in both the second region (102) and the connection region (103); fabricating an organic light emitting diode device on the substrate with the flexible base layer (20) formed thereon; and stripping the rigid base substrate (10) in the second region (102) along a boundary between the second region (102) and the connection region (103). By means of a flexible display technology, the above
(Continued)

method can achieve seamless assembly between adjacent sub-screens, and therefore increases display quality of pictures.

11 Claims, 4 Drawing Sheets

(51) Int. Cl.
 *H01L 27/32* (2006.01)
 *H01L 51/56* (2006.01)
(52) U.S. Cl.
 CPC ........ *H01L 27/3267* (2013.01); *H01L 51/004* (2013.01); *H01L 51/0034* (2013.01); *H01L 51/0035* (2013.01); *H01L 51/0097* (2013.01); *H01L 51/56* (2013.01); *H01L 2227/323* (2013.01); *H01L 2251/5338* (2013.01)

(56) References Cited

FOREIGN PATENT DOCUMENTS

| | | |
|---|---|---|
| CN | 204144263 U | 2/2015 |
| JP | H 07-105785 A | 4/1995 |
| JP | 2011-187489 A | 9/2011 |

OTHER PUBLICATIONS

International Search Report of PCT/CN2015/074406 in Chinese, mailed May 8, 2015 with English translation.
Notice of Transmittal of the International Search Report of PCT/CN2015/074406 in Chinese, mailed May 8, 2015.
Written Opinion of the International Searching Authority of PCT/CN2015/074406 in Chinese, mailed May 8, 2015 with English translation.
Second Chinese Office Action in Chinese Application No. 201410602823.1 mailed Mar. 2, 2017 with English translation.

\* cited by examiner

DISPLAY SCREEN AND METHOD OF PREPARE THE SAME

CROSS REFERENCE TO RELATED APPLICATIONS

This application is the National Stage of PCT/CN2014/074406 filed on Mar. 17, 2015, which claims priority under 35 U.S.C. §119 of Chinese Application No. 201410602823.1 filed on Oct. 31, 2014, the disclosure of which is incorporated by reference.

TECHNICAL FIELD

Embodiments of the invention relate to a display screen and a preparation method thereof.

BACKGROUND

In conventional technology, to achieve a multi-screen display function, a plurality of individual sub-screens need to be spliced to form a desired mosaic screen. However, in a conventional mosaic screen, a wide seam will be left between adjacent sub-screens due to existence of display screen frames, which thus affects a display effect of pictures.

SUMMARY OF THE INVENTION

Embodiments of the invention provide a display screen and a preparation method thereof. In the invention, adjacent sub-screens can be assembled in a seamless manner by means of a flexible display technology, so as to improve a display quality of frames.

An embodiment of the invention provides a method of preparing a display screen. The method comprises: forming a flexible base layer on a rigid base substrate, wherein the rigid base substrate comprises a first region, a second region, and a connection region between the first region and the second region; fabricating an organic light emitting diode device on the substrate with the flexible base layer formed thereon; and stripping the rigid base substrate in the second region along a boundary between the second region and the connection region.

An embodiment of the invention provides a display screen. The display screen comprises a rigid base substrate, a flexible base layer arranged side by side and overlapping with the rigid base substrate, and an organic light emitting diode device arranged above a substrate consisting of the rigid base substrate and the flexible base layer, wherein the flexible base layer is at least adhered to an edge of the rigid base substrate close to the flexible base layer, a region of the rigid base substrate forms a first sub-screen, and a region of the flexible base layer not overlapping with the rigid base substrate forms a second sub-screen.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

REFERENCE SIGNS

10—rigid base substrate; 10a—first sub-screen (rigid screen); 10b—second sub-screen (flexible screen); 101—first region; 102—second region; 103—connection region; 20—flexible base layer; 40—GOA circuit; 401—first GOA circuit; 402—second GOA circuit; 50—FPC; 501—first FPC; 502—second FPC; 60—PCB.

DESCRIPTION OF THE EMBODIMENTS

In order to make objects, technical details and advantages of the embodiments of the invention apparent, the technical solutions of the embodiment will be described in a clearly and fully understandable way in connection with the drawings related to embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
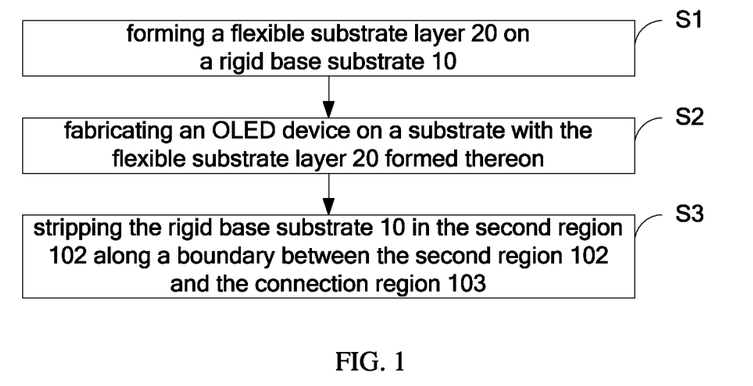
FIG. 1 is a flow chart of a preparation method of a display screen provided by an embodiment of the present invention.
Figure 2A:
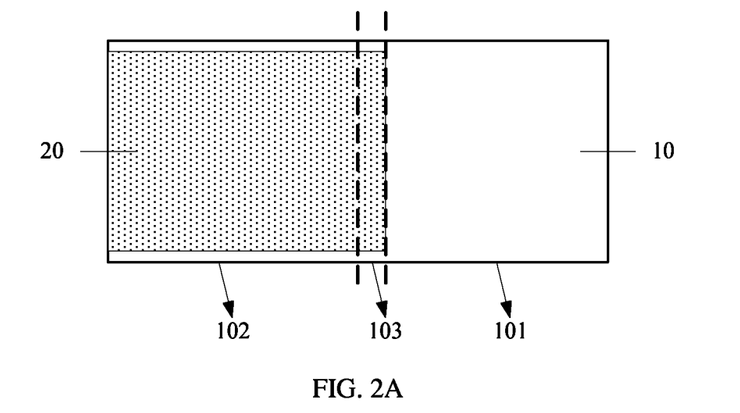
FIG. 2A and FIG. 2B are top views of a display screen provided by an embodiment of the present invention before and after part of a rigid base substrate is removed.

An embodiment of the invention provides a preparation method of a display screen. As illustrated in FIG. 1, the method comprises steps of:

S1: forming a flexible base layer 20 on a rigid base substrate 10, as illustrated in FIG. 2A.

For example, the rigid base substrate 10 is divided into a first region 101 and a second region 102 arranged side by side, as well as a connection region 103 between the first region 101 and the second region 102; and the flexible base layer 20 is formed in at least the second region 102 and the connection region 103.

The flexible base layer 20 may be formed in the second region 102 and the connection region 103, and may also be formed in the first region 101, the second region 102 and the connection region 103.

It is noted that in case the flexible base layer 20 is formed in the first region 101, the second region 102 and the connection region 103, the flexible base layer 20 may be formed in part or entire region of the first region 101; that is to say, in embodiments of the present invention, it is only required that the flexible base layer 20 is correspondingly formed in both the second region 102 and the connection region 103, and an area of the flexible base layer 20 in the first region 101 is not defined specifically.

S2: fabricating an Organic Light Emitting Diode (OLED) device on a substrate having the flexible base layer 20 formed thereon.

For example, a preparation process of the OLED device comprises: forming a cathode, an anode and an organic material functional layer between the cathode and the anode on a substrate, wherein the organic material functional layer comprises an electron transport layer, an organic light emitting layer and a hole transport layer.

Before preparation of the OLED device, the method may further comprise: preparing a thin film transistor (TFT) array on the substrate. It is noted that electrical insulation is required between the TFT array and the substrate; that is to say, an insulating layer should be formed between the TFT array and the substrate provided the substrate is electrical conductive.

Figure 2B:
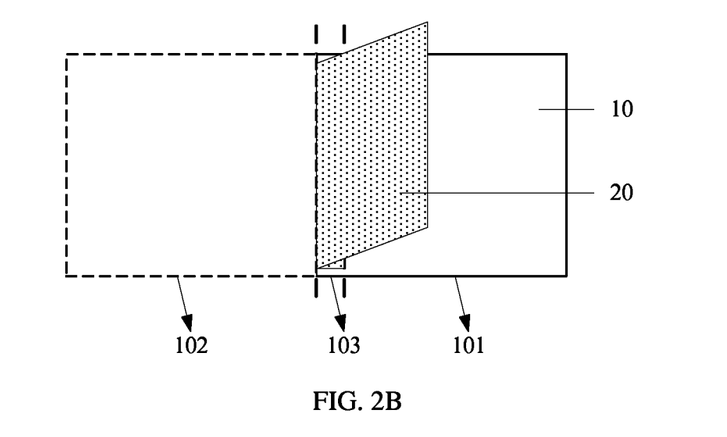

S3: stripping the rigid base substrate 10 in the second region 102 along a boundary between the second region 102 and the connection region 103, as illustrated in FIG. 2B.

The rigid base substrate 10 and the flexible base layer 20 are kept in connection state in the connection region 103. In such case, an OLED device is formed above the substrate in the connection region, and therefore the connection region may also achieve a display function.

Figure 3:
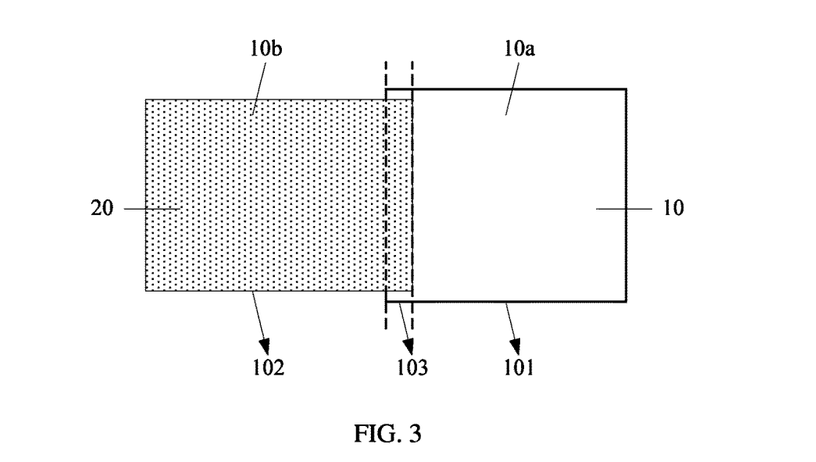
FIG. 3 is a structural schematic diagram of a display screen provided by an embodiment of the present invention.

According to the above steps S1-S3, a display screen consisting of a first sub-screen (rigid screen) 10a and a second sub-screen (flexible screen) 10b as illustrated in FIG. 3 can be prepared. Such a display screen does not have a seam at joint of the flexible screen 10b and the rigid screen 10a, so that seamless assembly can be realized, and therefore pictures can be displayed continuously.

It is noted that, in the drawings of the present invention, for convenience of illustrating a connection relationship between the flexible base layer 20 and the rigid base substrate 10, a dimension of the flexible base layer 20 is smaller than that of the rigid base substrate 10 in a direction parallel to a boundary between the second region 102 and the connection region 103, but in fact the flexible base layer 20 and the rigid base substrate 10 may have a same dimension in such direction.

The embodiments of the invention provide a display screen and a preparation method thereof. The method comprises: forming a flexible base layer 20 on a rigid base substrate 10, wherein the rigid base substrate 10 is divided into a first region 101, a second region 102 side by side, as well as a connection region 103 between the first region 101 and the second region 102, and the flexible base layer 20 is formed in at least both the second region 102 and the connection region 103; fabricating an OLED device on the substrate which has the flexible base layer 20 formed thereon; and stripping the rigid base substrate 10 in the second region 102 along a boundary between the second region 102 and the connection region 103.

In embodiments of the present invention, the flexible base layer 20 is directly formed on the rigid base substrate 10, and the OLED device is fabricated on a substrate consisting of the rigid base substrate 10 and the flexible base layer 20 together. On such basis, after the rigid base substrate 10 corresponding to the second region 102 is stripped, the second region 102 can form a flexible screen 10b correspondingly, the first region 101 and the connection region 103 can form a rigid screen 10a correspondingly, and no seam exists between the flexible screen 10b and the rigid screen 10a, so that seamless assembly between the flexible screen 10b and the rigid screen 10a can be realized, and therefore a display quality of pictures can be increased effectively. On this basis, the flexible screen 10b can be wound, spread or bent to a back surface of the rigid screen 10a based on a user's requirements, so as to achieve different display functions.

In one example, the step S3 comprises:

S21: laser cutting the rigid base substrate 10 along the boundary between the second region 102 and the connection region 103, so as to divide the rigid base substrate 10 into two parts.

Herein, it is required that energy for the laser cutting is capable of dividing the rigid base substrate 10 into two parts without damage to the flexible base layer 20.

S22: lifting the flexible base layer 20 in the second region 102 from a surface of the rigid base substrate 10, and removing the rigid base substrate 10 in the second region 102.

It is noted that, when the flexible base layer 20 is lifted from the surface of the rigid base substrate 10, it should be ensured that the rigid base substrate 10 is not separated from the flexible base layer 20 in the connection region 103.

In one example, the step S1 comprises: coating a polymer material on a surface of the rigid base substrate 10 so as to form the flexible base layer 20 after curing the polymer material.

For example, the polymer material comprises any one of Polyimide (PI), polyethylene (PE), Polypropylene (PP), Polystyrene (PS), Polyethylene Terephthalate (PET) and Polyethylene Naphthalate (PEN).

The rigid base substrate 10, for example, comprises any one of a glass substrate, a rigid plastic substrate, a sapphire substrate, a silicon substrate and a stainless steel substrate.

Taking an example that PI is coated on a surface of the glass substrate to illustrate, the process of forming the flexible base layer 20 comprises: forming a PI coating on a surface of the glass substrate by any one process comprising slot die coating, spin coating, blade coating, reverse printing and the like; performing a thermal curing treatment on the PI coating to render a polymerization reaction, so as to form a PI base layer with stable properties. In order to achieve a highly uniform coating, the PI coating is preferably formed by slot die coating process.

Figure 4:
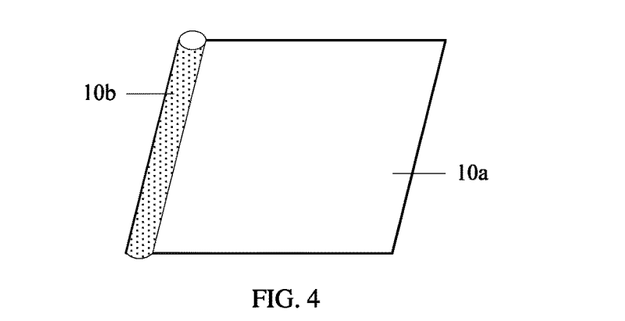
FIG. 4 is a structural schematic diagram of a display screen at a winding state provided by an embodiment of the present invention.

As described above, a display screen obtained by the preparation method provided by embodiments of the present invention can realize seamless assembly, and therefore continuity of picture display is ensured. As illustrated in FIG. 4, a flexible substrate is employed for the flexible screen 10b, so that the flexible screen 10b can be would in a direction pointing to the rigid screen 10a. Thus, the flexible screen 10b can be spread when double-screen display is required, and can be winded when double-screen display is not required or no display is required, so that space can be saved effectively, and the display screen can be moved conveniently.

Figure 5:
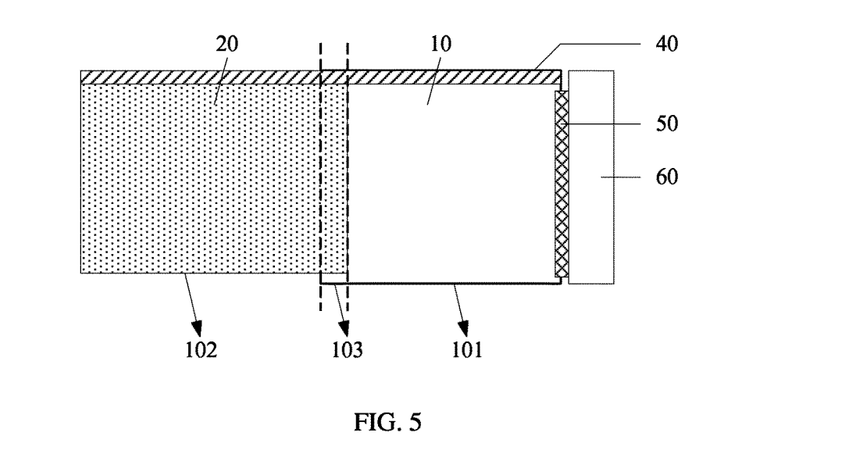
FIG. 5 is a schematic diagram I of a driving mode of a display screen provided by an embodiment of the present invention.

In one example, as illustrated in FIG. 5, before an OLED device is fabricated on the substrate with the flexible base layer 20 formed thereon, the method further comprises: preparing a Gate Driver on Array (GOA) circuit 40 on the substrate with the flexible base layer 20 formed thereon, wherein the GOA circuit 40 is used for controlling the entire display screen.

A preparation process of the GOA circuit 40 can be combined with that of the TFT array, so as to prepare a control circuit for controlling the OLED device.

It is noted that, as the GOA circuit 40 is formed on the substrate directly, part of the GOA circuit 40 is formed on the rigid base substrate 10, and the other part of the GOA circuit 40 is formed on the flexible base layer 20. In such case, part of the GOA circuit formed on the flexible base layer 20 can be winded together with the flexible base layer 20.

In one example, as illustrated in FIG. 5, before the rigid base substrate 10 in the second region 102 is stripped along a boundary between the second region 102 and the connection region 103, the method further comprises: adhering one side of the rigid base substrate 10 away from the second region 102 to a Flexible Printed Circuit (FPC) 50 by a hot-pressing process, and adhering the other side of the FPC 50 to a Printed Circuit Board (PCB) 60 by a hot-pressing process, wherein the FPC 50 is used for providing a carrier for a Chip On Film (COF).

After the above preparation process is completed, the display screen is to be packaged. For example, the display screen is subjected to flexible package, such as thin-film package.

Figure 6A:
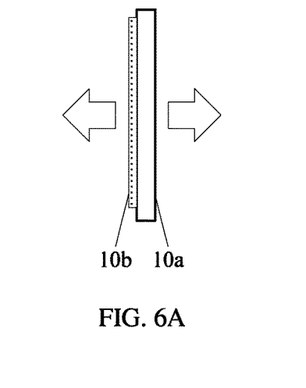
FIG. 6A and FIG. 6B are a sectional view and a structural schematic diagram of a double-sided display screen provided by an embodiment of the present invention.
Figure 6B:
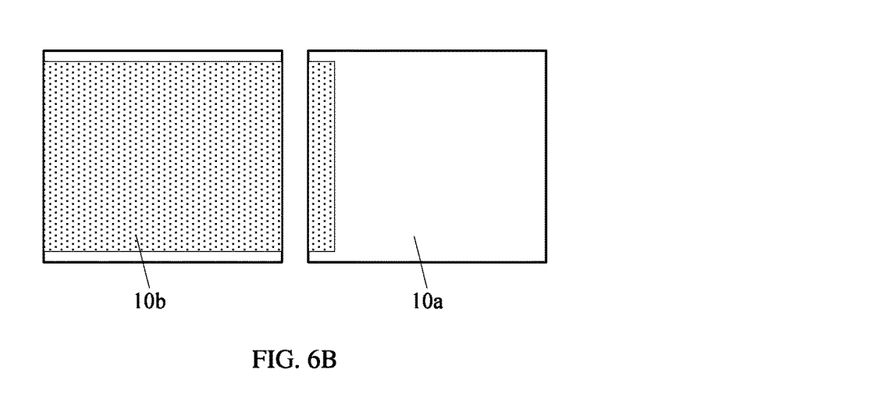

In one example, as illustrated in FIG. 6A and FIG. 6B, after the rigid base substrate 10 in the second region 102 is stripped along the boundary between the second region 102 and the connection region 103, the method further comprises: bending and adhering the flexible base layer 20 in the second region 102 to a back surface of the rigid base substrate 10, namely, bending and adhering the flexible screen 10b to a back surface of the rigid screen 10a.

FIG. 6A is a sectional view of a display screen after being adhered, and FIG. 6B is a front view (right) and a back view (left) of the display screen after being adhered.

A display screen with a double-sided display function can be obtained by adhering the flexible screen 10b to the back surface of the rigid screen 10a. Compared with known double-sided displays, the double-sided display screen provided by the embodiment of the present invention is ultra-thin and ultralight as the flexible screen 10b is directly adhered to the back surface of the rigid screen 10a. Further, a preparation process of the double-sided display screen can be simplified as the flexible screen 10b and the rigid screen 10a are prepared together; in addition, OLED devices are also arranged on a side surface where the flexible screen 10b is connected with the rigid screen 10a, and therefore a side display function can also be achieved.

As illustrated in FIG. 5, part of the GOA circuit 40 is formed on the rigid base substrate 10, and the other part thereof is formed on the flexible base layer 20, so part of the GOA circuit formed on the flexible base layer 20 can be bent and adhered to the back surface of the rigid base substrate 10 together with the flexible base layer 20.

In order to conveniently illustrate distribution of the GOA circuit 40, front and back surfaces of the display screen are unfolded in the same plane for description in the drawings.

By the above means, the entire display screen is controlled by one GOA circuit. In the embodiments of the present invention, front display and back display of the display screen can also be controlled individually by two GOA circuits.

Figure 7:
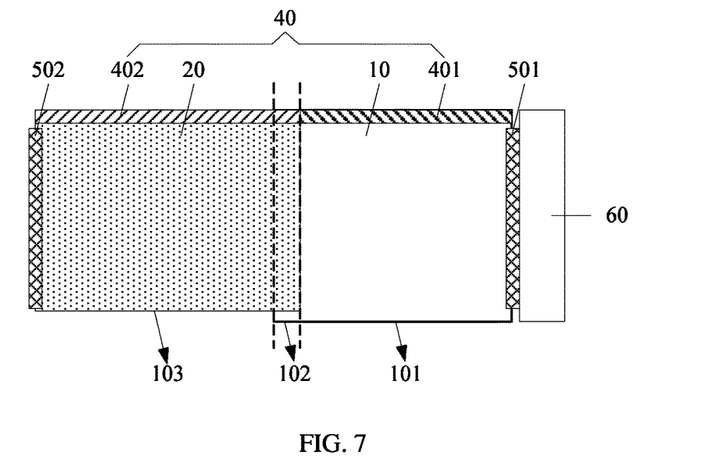
FIG. 7 is a schematic diagram II of a driving mode of a display screen provided by an embodiment of the present invention.

In one example, as illustrated in FIG. 7, before an OLED device is fabricated on a substrate with the flexible base layer 20 formed thereon, the method further comprises: fabricating a GOA circuit 40 on a substrate with the flexible base layer 20 formed thereon, wherein the GOA circuit 40 comprises a first GOA circuit 401 for controlling the display screen corresponding to the first region 101 and a second GOA circuit 402 for controlling the display screen corresponding to the second region 102 and the connection region 103.

The first region 101 corresponds to a front surface of the display screen, the connection region 103 corresponds to an edge of the front surface of the display screen, and the second region 102 corresponds to a side surface and a back surface of the display screen. In such case, a front display of the display screen is controlled by the first GOA circuit 401 and the second GOA circuit 402 on the front surface, a back display of the display screen is controlled by the second GOA circuit 402 on the back surface, and a side display of the display screen is controlled by the second GOA circuit 402 on the side surface.

In one example, as illustrated in FIG. 7, before the rigid base substrate 10 in the second region 102 is stripped along the boundary between the second region 102 and the connection region 103, the method further comprises: adhering one side of the rigid base substrate 10 away from the second region 102 to a first FPC 501 by a hot-pressing process, and adhering one side of the flexible base layer 20 away from the first region 101 to a second FPC 502 by a hot pressing process.

In one example, as illustrated in FIG. 7, after the flexible base layer 20 in the second region 102 is adhered to the back surface of the rigid base substrate 10, the method further comprises: adhering the other sides of the first FPC 501 and the second FPC 502 which overlap with each other to a PCB 60 by a hot pressing process.

After the flexible base layer 20 is bent and adhered to the back surface of the rigid base substrate 10, the first FPC 501 is overlapped with the second FPC 502, and both of them are connected with the PCB 60.

Herein, the PCB 60 may be a single PCB or two PCBs at same position, so that space can be saved, and narrow frames of the display screen can be realized.

Figure 8A:
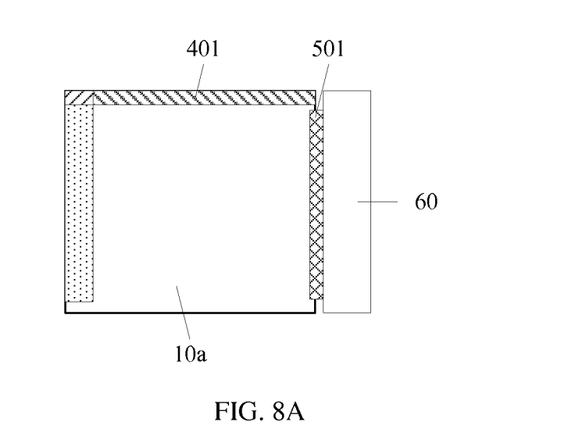
FIG. 8A and FIG. 8B are structural schematic diagrams of a front surface/a back surface of a double-sided display screen provided by an embodiment of the present invention.
Figure 8B:
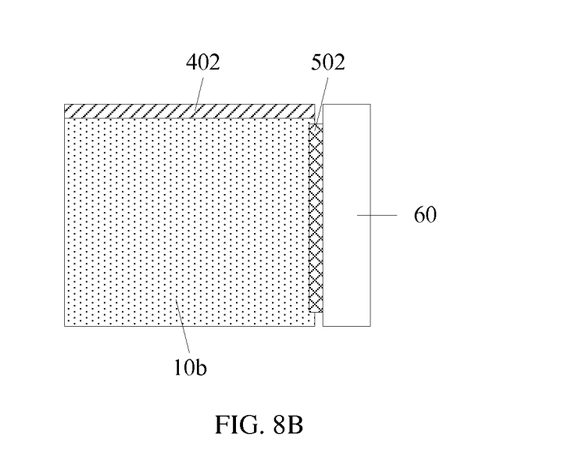

FIG. 8A and FIG. 8B illustrate structural schematic diagrams of a front surface and a back surface of a display screen with a double-sided display function.

The display screen needs to be packaged after the above preparation processes are completed. In the embodiment, the display screen can be firstly subjected to flexible package, e.g. thin-film package, and then the flexible screen 10b is adhered to the back surface of the rigid screen 10a; of course, the flexible screen 10b can be firstly adhered to the back surface of the rigid screen 10a, and then the display screen is subjected to flexible package, e.g., thin-film package.

An embodiment of the present invention further provides a display screen, as illustrated in FIG. 3. The display screen comprises a rigid base substrate 10, a flexible base layer 20 arranged side by side and overlapping with the rigid base substrate 10, and an OLED device (not shown) arranged above a substrate consisting of the rigid base substrate 10 and the flexible base layer 20, wherein the flexible base layer 20 is at least overlapped with an edge of the rigid base substrate 10 close to the flexible base layer 20 (a region 103 as illustrated in diagram); wherein the region where only the rigid base substrate 10 is located forms a first sub-screen (rigid screen) 10a correspondingly, and a region of the flexible base layer 20 not overlapping with the rigid base substrate 10 forms a second sub-screen (flexible screen) 10b correspondingly.

It is noted that there is an overlapped region between the first sub-screen 10a and the second sub-screen 10b, and in fact the rigid base substrate 10 and the flexible base layer 20 together serve as a substrate of the OLED device corresponding to the overlapped region. In such case, the flexible base layer 20 may be only overlapped with an edge of the rigid base substrate 10 to ensure connection therebetween; or, the flexible base layer 20 may be spread over an entire surface of the rigid base substrate 10, one side of the flexible base layer 20 is aligned with one side of the rigid base substrate 10, the other side of the flexible base layer 20 extends beyond the rigid base substrate 10; namely, an overlapped region between the flexible base layer 20 and the rigid base substrate 10 is the entire rigid base substrate 10; of course, an overlapped area between the flexible base layer 20 and the rigid base substrate 10 may also be a case between the above two cases, which will not be defined in detail herein. In the embodiments of the present invention, in order to facilitate distinction, unless otherwise specified, the overlapped region between the flexible base layer 20 and the rigid base substrate 10 specifically refers to the overlapped region between the flexible base layer 20 and the edge of the rigid base substrate 10 (i.e., the first case described above), which may correspond to the connection region in the preparation method.

The display region corresponding to the overlapped region may belong to the first sub-screen 10a, and the second sub-screen 10b refers to a display screen which is arranged on the flexible base layer 20 and corresponds to the part beyond the overlapped region.

As for a width of the overlapped region between the first sub-screen 10a and the second sub-screen 10b (a dimension of the overlapped region in a direction pointing from the first sub-screen 10a to the second sub-screen 10b), the smaller the better, as long as a stable connection between the second sub-screen 10b and the first sub-screen 10a can be ensured, so that the second sub-screen 10b will not be separated from the first sub-screen 10a at a winding, spreading, or bending state.

On this basis, in the embodiments of the present invention, the rigid base substrate 10 serves as a substrate of the first sub-screen (rigid screen) 10a, the flexible base layer 20 which is not overlapped with the rigid base substrate 10 serves as a substrate of the second sub-screen (flexible screen) 10b, and the OLED device is correspondingly arranged in the overlapped region between the rigid base substrate 10 and the flexible base layer 20, so that the rigid screen 10a and the flexible screen 10b can be assembled in a seamless manner, pictures can also be displayed in the overlapped region between the rigid screen 10a and the flexible screen 10b, and accordingly pictures can be displayed continuously to increase a display quality. On this basis, the flexible screen 10b may be wounded, spread or bent to the back surface of the rigid screen 10a based on a user's requirements so as to achieve different display functions.

As illustrated in FIG. 4, the second sub-screen 10b is wound in a direction towards the first sub-screen 10a. Thus, the user may spread the second sub-screen 10b when double-sided display is required, and wind the second sub-screen 10b when double-sided display is not required, so that space occupied by the display is saved effectively, and it is favorable to move the display screen.

In one example, as illustrated in FIG. 5, the display screen further comprises a GOA circuit 40 for controlling the entire display screen, an FPC 50 arranged on one side of the first sub-screen 10a away from the second sub-screen 10b, and a PCB 60 connected to the other side of the FPC 50.

In such case, part of the GOA circuit 40 is arranged on the rigid base substrate 10, and the other part thereof is arranged on the flexible base layer 20, wherein part of the GOA circuit arranged on the flexible base layer 20 may be wound together with the flexible base layer 20. On such basis, the display screen can achieve a double-sided display function by providing different image signals to part of the GOA circuit corresponding to the first sub-screen 10a and the other part of GOA circuit corresponding to the second sub-screen 10b.

In one example, as illustrated in FIG. 6A and FIG. 6B, one side of the second sub-screen 10b away from the first sub-screen 10a is bent and adhered to the back surface of the first sub-screen 10a. Thus, the display screen can realize double-sided display. Compared with known double-sided displays, the display screen with a double-sided display function provided by the embodiments of the present invention is thinner and lighter.

In one example, as illustrated in FIG. 7, the display screen further comprises a first GOA circuit 401 for controlling the first sub-screen 10a, a second GOA circuit 402 for controlling the second sub-screen 10b, a first FPC 501 arranged on one side of the first sub-screen 10a away from the second sub-screen 10b, a second FPC 502 arranged on one side of the second sub-screen 10b away from the first sub-screen 10a, and a PCB 60 connected with both the first FPC 501 and the second FPC 502.

The display screen can achieve a double-sided display function by providing different image signals to the first GOA circuit 401 corresponding to the first sub-screen 10a and the second GOA circuit 402 corresponding to the second sub-screen 10b.

The rigid base substrate 10 and the flexible base layer 20 are made from materials as described above, which will not be repeated here.

To sum up, in the embodiments of the present invention, the flexible base layer is directly formed on the rigid base substrate, and the OLED device is fabricated on a substrate consisting of the rigid base substrate and the flexible base layer. On such basis, after the rigid base substrate corresponding to the second region is stripped, the second region can form a flexible screen correspondingly, the first region and the connection region can form a rigid screen correspondingly, and no seam exists between the flexible screen and the rigid screen, so that seamless assembly between the flexible screen and the rigid screen can be realized, and therefore a display quality of frames can be increased effectively. On this basis, the flexible screen can be wound, spread or bent to the back surface of the rigid screen based on a user's requirements, so as to achieve different display functions.

What is described above is related to the illustrative embodiments of the disclosure only and not limitative to the scope of the disclosure; the scopes of the disclosure are defined by the accompanying claims.

The present application claims priority of Chinese Patent Application No. 201410602823.1 filed on Oct. 31, 2014, the disclosure of which is incorporated herein by reference in its entirety as part of the present application.

What is claimed is:
1. A method of preparing a display screen, comprising:
   forming a flexible base layer on a rigid base substrate, wherein the rigid base substrate comprises a first region, a second region, and a connection region between the first region and the second region, and the flexible base layer is formed in at least both the second region and the connection region;
   fabricating an organic light emitting diode device on the substrate with the flexible base layer formed thereon;
   stripping the rigid base substrate in the second region along a boundary between the second region and the connection region;

wherein, before the step of fabricating an organic light emitting diode device on the substrate with the flexible base layer formed thereon, the method further comprises:

preparing a gate driver on array circuit on the substrate with the flexible base layer formed thereon, the gate driver on array circuit being configured for controlling an entire display screen.

2. The method according to claim 1, wherein the step of stripping the rigid base substrate in the second region along a boundary between the second region and the connection region comprises:

laser cutting the rigid base substrate along the boundary between the second region and the connection region to divide the rigid base substrate into two parts; and lifting the flexible base layer in the second region from a surface of the rigid base substrate, and removing the rigid base substrate in the second region.

3. The method according to claim 1, wherein the step of forming a flexible base layer on a rigid base substrate comprises:

coating a polymer material on a surface of the rigid base substrate, and curing the polymer material to form the flexible base layer.

4. The method according to claim 3, wherein the polymer material comprises any one of polyimide, polyethylene, polypropylene, polystyrene, polyethylene terephthalate and polyethylene naphthalate.

5. The method according to claim 1, wherein, before the step of stripping the rigid base substrate in the second region along a boundary between the second region and the connection region, the method further comprises:

adhering one side of the rigid base substrate away from the second region to a flexible printed circuit, and adhering the other side of the flexible printed circuit to a printed circuit board.

6. The method according to claim 1, wherein, after the step of stripping the rigid base substrate in the second region along a boundary between the second region and the connection region, the method further comprises:

bending and adhering the flexible base layer in the second region to a back surface of the rigid base substrate.

7. The method according to claim 6, wherein, before the step of fabricating an organic light emitting diode device on the substrate with the flexible base layer formed thereon, the method further comprises:

preparing a gate driver on array circuit on the substrate with the flexible base layer formed thereon, the gate driver on array circuit being configured for controlling an entire display screen.

8. The method according to claim 7, wherein, before the step of stripping the rigid base substrate in the second region along a boundary between the second region and the connection region, the method further comprises:

adhering one side of the rigid base substrate away from the second region to a flexible printed circuit, and adhering the other side of the flexible printed circuit to a printed circuit board.

9. The method according to claim 6, wherein, before the step of fabricating an organic light emitting diode device on the substrate with the flexible base layer formed thereon, the method further comprises:

preparing a gate driver on array circuit on the substrate with the flexible base layer formed thereon;

wherein the gate driver on array circuit comprises a first gate driver on array circuit being configured for controlling the display screen in the first region and a second gate driver on array circuit being configured for controlling the display screen in both the second region and the connection region.

10. The method according to claim 9, wherein, before the step of stripping the rigid base substrate in the second region along a boundary between the second region and the connection region, the method further comprises:

adhering one side of the rigid base substrate away from the second region to a first flexible printed circuit, and adhering the other side of the flexible base layer away from the first region to a second flexible printed circuit.

11. The method according to claim 10, wherein, after adhering the flexible base layer in the second region to a back surface of the rigid base substrate, the method further comprises:

adhering the other sides of the first flexible printed circuit and the second flexible printed circuit to a printed circuit board, the first flexible printed circuit and the second flexible printed circuit being overlapped with each other.

* * * * *